United States Patent
Yu et al.

(10) Patent No.: US 8,598,617 B2
(45) Date of Patent: Dec. 3, 2013

(54) METHODS OF FABRICATING LIGHT EMITTING DIODE PACKAGES

(75) Inventors: Chih-Kuang Yu, Chiayi (TW); Chyi Shyuan Chern, Taipei (TW); Hsing-Kuo Hsia, Jhubei (TW); Hung-Yi Kuo, Taipei (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 0 days.

(21) Appl. No.: 13/557,272

(22) Filed: Jul. 25, 2012

(65) Prior Publication Data

US 2012/0286240 A1    Nov. 15, 2012

Related U.S. Application Data

(63) Continuation of application No. 13/050,549, filed on Mar. 17, 2011, now Pat. No. 8,241,932.

(51) Int. Cl.
    *H01L 33/00*    (2010.01)
(52) U.S. Cl.
    USPC ........ 257/99; 257/88; 257/734; 257/E33.056; 257/E33.066
(58) Field of Classification Search
    USPC ............... 257/88.99, 734, E33.056, E33.066
    See application file for complete search history.

(56) References Cited

U.S. PATENT DOCUMENTS

| | | |
|---|---|---|
| 7,244,628 B2 | 7/2007 | Tamura et al. |
| 7,691,656 B2 | 4/2010 | Bader et al. |
| 7,880,182 B2 | 2/2011 | Yao et al. |
| 8,211,724 B2 | 7/2012 | Kim et al. |
| 2009/0272991 A1 | 11/2009 | Lee et al. |
| 2010/0171215 A1 | 7/2010 | Fischer et al. |
| 2010/0200876 A1 | 8/2010 | Pan et al. |
| 2010/0252840 A1 | 10/2010 | Ibbetson et al. |
| 2010/0258827 A1 | 10/2010 | Lee et al. |
| 2011/0006322 A1* | 1/2011 | Li et al. .................. 257/98 |
| 2011/0059559 A1 | 3/2011 | Yen et al. |
| 2011/0133216 A1 | 6/2011 | Sugawara |
| 2011/0210351 A1 | 9/2011 | Kim et al. |
| 2012/0056212 A1 | 3/2012 | Huang et al. |

* cited by examiner

*Primary Examiner* — Asok K Sarkar
(74) *Attorney, Agent, or Firm* — Haynes and Boone, LLP (57) ABSTRACT

An LED array comprises a growth substrate and at least two separated LED dies grown over the growth substrate. Each of LED dies sequentially comprise a first conductive type doped layer, a multiple quantum well layer and a second conductive type doped layer. The LED array is bonded to a carrier substrate. Each of separated LED dies on the LED array is simultaneously bonded to the carrier substrate. The second conductive type doped layer of each of separated LED dies is proximate to the carrier substrate. The first conductive type doped layer of each of LED dies is exposed. A patterned isolation layer is formed over each of LED dies and the carrier substrate. Conductive interconnects are formed over the patterned isolation layer to electrically connect the at least separated LED dies and each of LED dies to the carrier substrate.

20 Claims, 7 Drawing Sheets

METHODS OF FABRICATING LIGHT EMITTING DIODE PACKAGES

PRIORITY DATA

This application claims priority to application Ser. No. 13/050,549, filed on Mar. 17, 2011, entitled "METHODS OF FABRICATING LIGHT EMITTING DIODE PACKAGES," the disclosure of which is incorporated herein by reference in its entirety.

TECHNICAL FIELD

The disclosure relates generally to a Light-Emitting Diode (LED) package, and more particularly to a method of fabricating an LED package.

BACKGROUND

Light emitting diodes (LEDs) emit light when voltages are applied across a P/N junction. LED devices are widely used in various applications such as indicators, signs, light sources, and other types of lighting. LED devices are fabricated and further packaged for applications. Traditional methods of packaging LEDs include bonding LED dies to package substrates separately, which is not cost-effective and introduces more manufacturing challenges when the LED dices shrink to smaller sizes. For example, electrical connections by wire bond between a LED die and the corresponding package substrate becomes increasingly difficult to apply as the size of the LED die becomes progressively smaller. This limits the use of wire bonding for LED dies with a small form factor. Furthermore, wire bonding of interconnects is a sequential process that requires increased assembly time as the number of bonding wires increases. In addition, the length of the bonding wires may degrade electrical and optical characteristics of the packaged LEDs. Accordingly, there is a need for LED packaging structures and methods that are capable of providing electrical connections for LEDs with a small form factor while reducing manufacturing time and cost.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

Figure 1A:
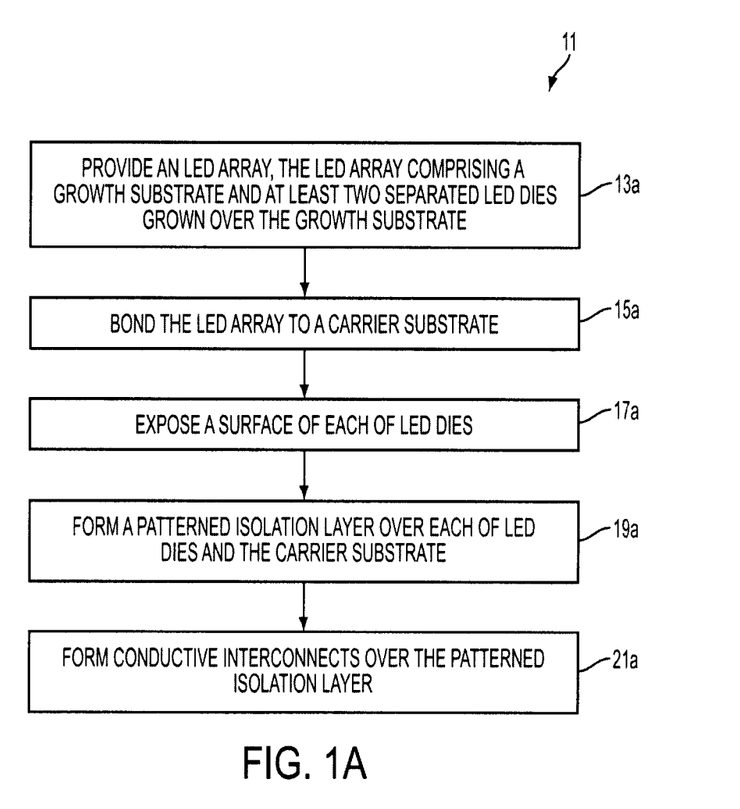
FIGS. 1A and 1B are flowcharts of methods for fabricating Light-Emitting Diode (LED) packages according to embodiments of the disclosure.
Figure 1B:
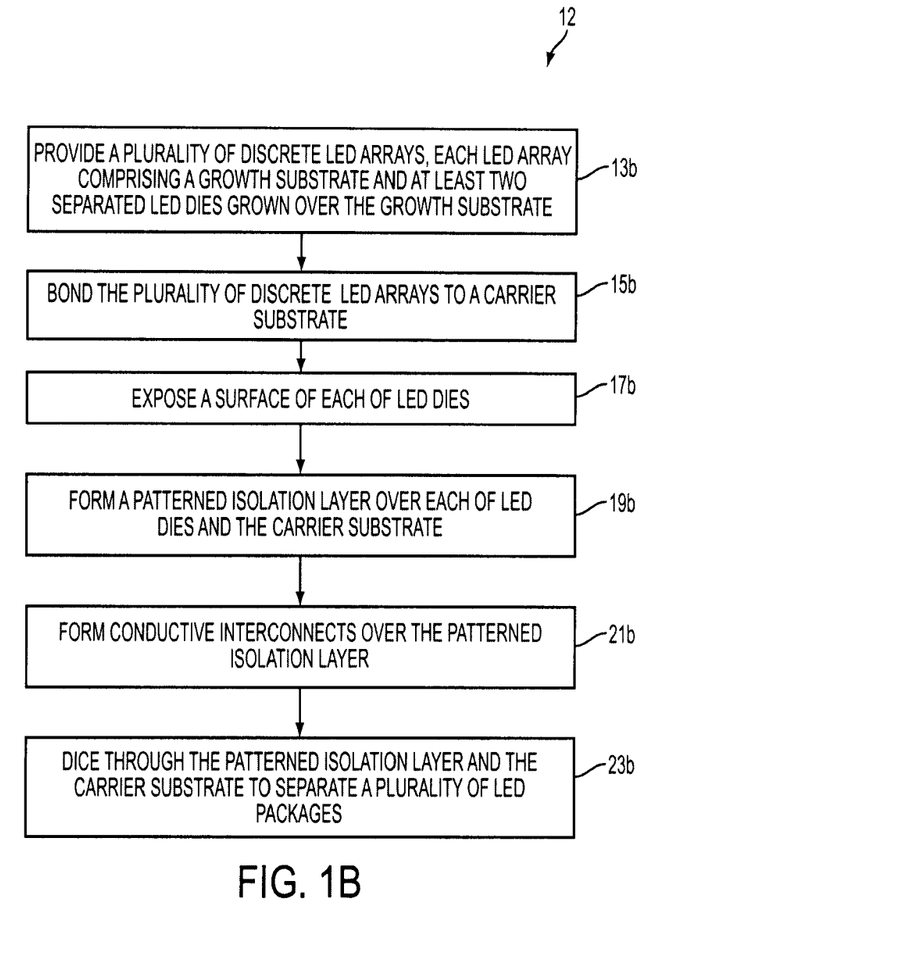
Figure 9:
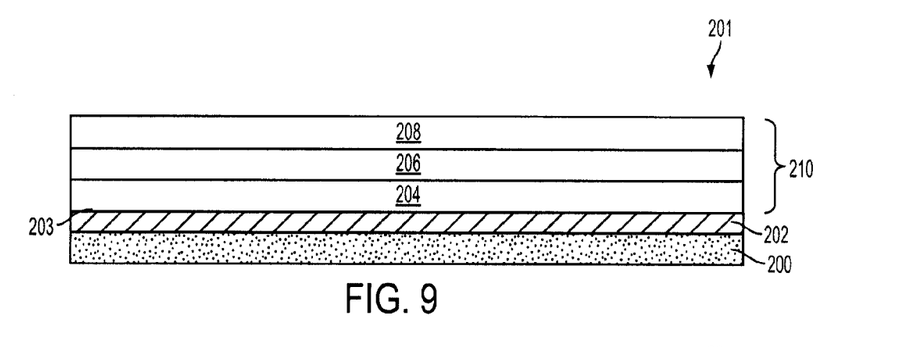
FIGS. 9 to 11 are cross-sectional views of a structure for forming LED arrays at various stages of manufacture according to embodiments of the disclosure.
Figure 10:
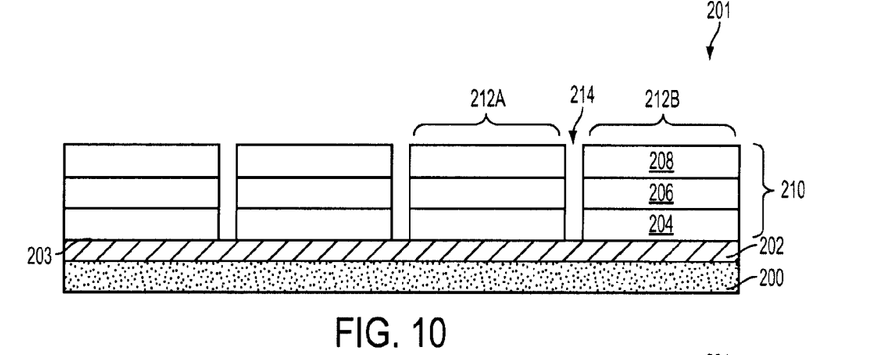
Figure 11:
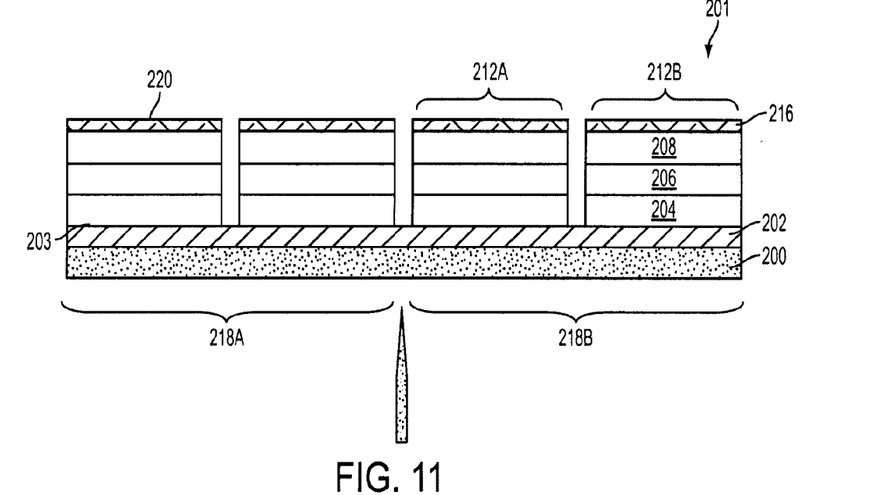

Illustrated in FIGS. 1A and 1B are flowcharts of methods 11 and 12 for fabricating Light-Emitting Diode (LED) packages according to embodiments of the disclosure. FIG. 1A illustrates generalized operations that are performed with various embodiments of the disclosure. FIG. 1B illustrates different embodiments that include the generalized operations of FIG. 1A. FIGS. 2 to 8 are cross-sectional views of a structure 100 for forming LED packages at various stages of manufacture according to FIGS. 1A and 1B. FIGS. 9 to 11 are cross-sectional views of a structure 201, which are incorporated in the structure 100, for forming LED arrays at various stages of manufacture in accordance with this disclosure.

An LED device may be a part of a display or lighting device having a number of modules, the LEDs in each module being either controlled singly or in combination. The LED may also be a part of an integrated circuit (IC) chip, system on chip (SoC), or portion thereof, that may include various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high power MOS transistors, or other types of transistors. It is understood that various figures have been simplified for a better understanding of the inventive concepts of the present disclosure. Accordingly, it should be noted that additional processes may be provided before, during, and after the methods of FIGS. 1A and 1B. Some other processes may only be briefly described, and various processes may be substituted for the described processes to achieve the same effect.

Referring now to FIG. 1A, method 11 for fabricating an LED package begins with operation 13a. At operation 13a, a LED array is provided. The LED array includes a growth substrate and at least two separated LED dies grown over the growth substrate. Each of LED dies includes multiple layers grown on a top surface of the growth substrate. The multiple layers sequentially include a first conductive type doped layer, a multiple quantum well layer (MQW) and a second conductive type doped layer. The method 11 continues with operation 15a in which the LED array is bonded to a carrier substrate. Each of separated LED dies on the LED array is simultaneously bonded to the carrier substrate. The second conductive type doped layer of each of separated LED dies is proximate to the carrier substrate. The method 11 continues with operation 17a in which a surface, which is proximate to the top surface of the growth substrate, of the first conductive type doped layer for each of LED dies is exposed. The method 11 continues with operation 19a in which a patterned isolation layer is formed over each of LED dies and the carrier substrate. The method 11 continues with operation 21a in which conductive interconnects are formed over the patterned isolation layer. In one embodiment, conductive interconnects electrically connect each of LED dies to the carrier substrate. In another embodiment, conductive interconnects electrically connect the at least two separated LED dies and each of LED dies to the carrier substrate. Other layers, lines, vias and structures may also be provided before, during, or after the steps of method 11.

FIG. 1B illustrates different embodiments that include the generalized operations of the method 11 in FIG. 1A. The method 12 of fabricating a plurality of LED packages begins at operation 13b. At operation 13b, a plurality of discrete LED arrays are provided. Each of LED arrays includes a growth substrate and at least two separated LED dies grown over the growth substrate. The method 12 continues with operation 15b in which the plurality of LED arrays are bonded to a carrier substrate at a wafer level. Each of discrete LED arrays is bonded by simultaneously bonding each of separated LED dies to the carrier substrate. Each of LED dies includes multiple layers grown on a top surface of the growth substrate. The multiple layers sequentially include a first conductive type doped layer, a multiple quantum well layer (MQW) and a second conductive type doped layer. The method 12 continues with operation 17b, which is the same as the operation 17a in method 11. At operation 17b, a surface, which is proximate to a top surface of the growth substrate, of the first conductive type doped layer for each of LED dies is exposed. The method 12 continues with operation 19b, which is the same as the operation 19a in method 11. At operation 19b, a patterned isolation layer is formed over each of LED dies and the carrier substrate. The method 12 continues with operation 21b, which is the same as the operation 21a in method 11. At operation 21b, conductive interconnects are formed over the patterned isolation layer. In one embodiment, conductive interconnects electrically connect each of separated LED dies to the carrier substrate. In another embodiment, conductive interconnects electrically connect the at least two separated LED dies and each of LED dies to the carrier substrate. The method 12 continues with operation 23b. At operation 23b, the patterned isolation layer and the carrier substrate are diced to separate a plurality of LED packages. In one embodiment, each of the plurality of LED packages comprises one LED die. In another embodiment, each of the plurality of LED packages comprises at least two separated LED dies. Other layers, lines, vias and structures may also be provided before, during, or after the steps of method 12. The described process order is variable in further embodiments.

Figure 2:
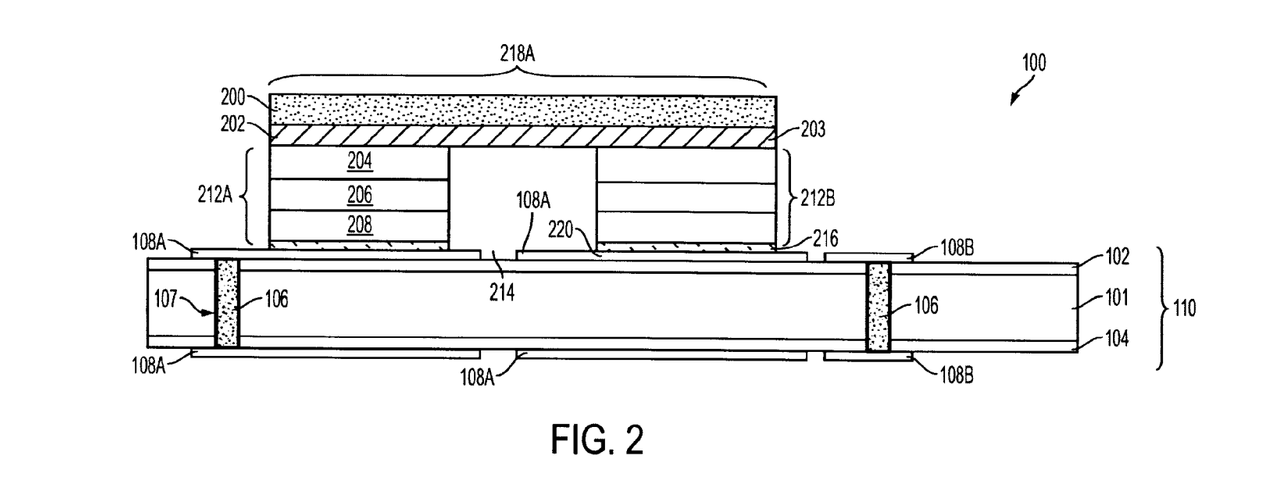
FIGS. 2 to 8 are cross-sectional views of a structure for forming LED packages at various stages of manufacture according to FIGS. 1A and 1B.

FIGS. 2 to 8 are cross-sectional views of a structure 100 for forming LED packages at various stages of manufacture according to FIGS. 1A and 1B. FIG. 2 illustrates a stage in which a structure 100 is provided, e.g., in accordance with operation 13b and operation 15b of FIG. 1B. The structure 100 includes a plurality of discrete LED arrays 218A bonded to a carrier substrate 110. In the present example, only one LED array 218A is provided for illustration. LED array 218A includes a growth substrate 200 and at least two separated LED dies 212A/212B grown over the growth substrate 200. The LED die 212A and the LED die 212B are separated by a trench 214. Each of discrete LED arrays 218A is bonded by simultaneously bonding each of separated LED dies 212A/212B to the carrier substrate 110.

The LED die 212A/212B includes a first conductive type doped semiconductor layer 204 (e.g., an n-type doped layer) and a second type conductive type doped semiconductor layer 208 (e.g., a p-type doped layer) configured as a PN junction designed to emit light during operation. In current embodiment, the LED die 212A/212B includes multiple layers grown over a top surface of the growth substrate 200. The multiple layers sequentially include the first conductive type doped layer 204, a multiple quantum well layer (MQW) 206 and the second conductive type doped layer 208. An un-doped semiconductor layer 202 is referred to a buffer layer between the growth substrate 200 and the LED die 212A/212B. The MQW 206 is sandwiched in the PN junction for tuned characteristics and enhanced performance. The LED die 212A/212B further includes a bottom metal contact layer 216 (e.g., p-contact) connected to the second type conductive type doped semiconductor layer 208 (e.g., a p-type doped layer) as a bottom electrode. The bottom metal contact layer 216 may be nickel, silver, or nickel/silver alloys.

The carrier substrate 110 is adjacent to the bottom electrode 216. The carrier substrate 110 is designed to provide mechanical strength, electrical coupling and a thermal conductive path for the LED dies 212A/212B. In one embodiment, the carrier substrate 110 includes a silicon wafer 101. The carrier substrate 110 further includes thin dielectric films 102 and 104 formed on the top and bottom surfaces of the silicon wafer 101, respectively. The thin dielectric films 102 and 104 may include silicon oxide, silicon nitride, silicon oxynitride, silicon carbide, diamond-like carbon or other suitable dielectric material. In the present embodiment, the thin dielectric films 102 and 104 include silicon oxide and are formed by thermal oxidation, chemical vapor deposition (CVD) or other suitable technique. In another embodiment, the carrier substrate 110 includes ceramic substrate, directed copper bonded substrate, composite substrate and printed circuit board (PCB).

The carrier substrate 110 further includes a plurality of through-silicon vias (TSVs) 106 embedded in the carrier substrate 110. Various TSVs 106 are formed and embedded in the silicon wafer 101 and are configured to provide electrical connection to the electrodes of the LED dies 212A/212B. In one embodiment, the TSVs 106 include a conductive material, such as copper or other suitable metal/metal alloy. The TSVs 106 can be formed by a procedure including etching a plurality of vias in the silicon wafer 101 of the carrier substrate 110 and depositing the conductive material to fill the plurality of vias to form TSVs 106. The deposition may include physical vapor deposition (PVD), plating, a combination, or other suitable technique.

The TSVs 106 may further include a thin dielectric material layer 107 formed on the sidewalls of the vias to separate the TSVs 106 from the silicon wafer 101 for electrical isolation. The thin dielectric material layer 107 may include silicon oxide, silicon nitride, silicon oxynitride, silicon carbide, diamond-like carbon or other suitable dielectric material. In the present embodiment, the thin dielectric material layer 107 includes silicon oxide and is formed by thermal oxidation, CVD or other suitable technique.

The carrier substrate 101 further includes various metal bonding pads 108A and metal contact pads 108B positioned on the top surface and the bottom surface of the silicon wafer 101. The metal bonding pads 108A and metal contact pads 108B are deposited on the thin dielectric films 102 and 104 respectively. Each of the metal bonding pads 108A and metal contact pads 108B is separated and is electrically isolated by the thin dielectric films 102 and 104 respectively. The metal bonding pads 108A and the metal contact pads 108B on the top surface and the bottom surface of the silicon wafer 101 are designed to couple together by way of one of the TSVs 106. The metal bonding pads 108A function as electrodes of the LED dies 212A/212b at the packaging level. Particularly, the bottom electrode 216 is bonded to the metal bonding pad 108A on the top surface of the silicon wafer 102 and electrically coupled to the corresponding metal bonding pads 108A on the bottom surface of the silicon wafer 101 through the metal bonding pads 108A on the top surface of the silicon wafer 101 and one of the TSVs 106. The metal contact pads 108B also function as electrodes of the LED dies 212A/212b at the packaging level. The metal contact pads 108B and a top electrode 112 (shown in FIG. 7) of the LED die 212A/212b are electrically connected through the conductive interconnects 118 (shown in FIG. 7) formed in the following operation. In various embodiments, the metal bonding pad 108A and metal contact pads 108B include metal or metal alloy with good conductive properties (both electrical and thermal), and good bonding properties. Examples include gold, gold alloy, copper, copper alloy, nickel, nickel alloy, platinum, platinum alloy, titanium, titanium alloy, or combinations thereof.

Figure 3:
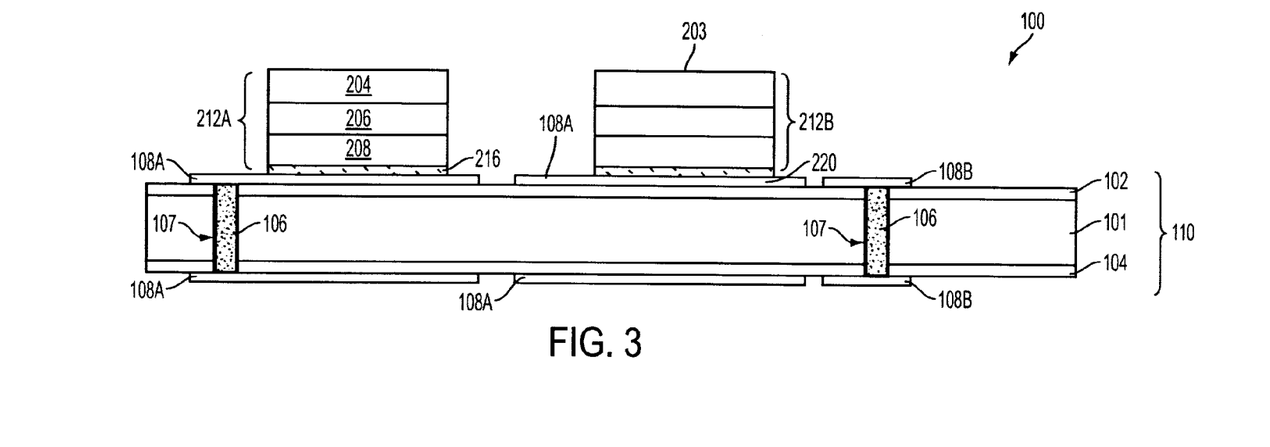

FIG. 3 illustrates a stage in which a surface 203 of the first conductive type doped semiconductor layer 204 for each of LED dies 212A/212B in a structure 100 is exposed, e.g., in accordance with operation 17b of FIG. 1B. The growth substrate 200 and the un-doped semiconductor layer 202 are removed from LED dies 212A/212B of the structure 100. For a sapphire growth substrate, the growth substrate removal may be by means of a laser lift-off (LLO) technique. For a silicon-based growth substrate, removal may be by means of dry or wet etching techniques. Similarly, the un-doped semiconductor layer 202 is removed. Removal of the growth substrate 200 and the un-doped semiconductor layer 202 exposes the surface 203, which is proximate to the top surface of the growth substrate 200, of the first conductive type doped semiconductor layer 204. The LED die 212A and the LED die 212B in the LED array 218A are physically separated in this stage.

Figure 4:
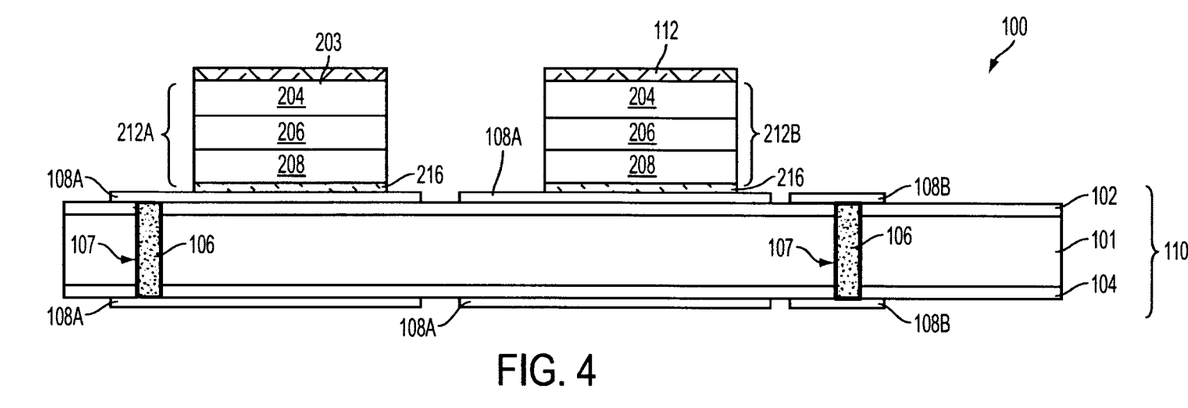

FIG. 4 illustrates a stage in which a top metal contact layer 112 is formed on the surface 203 of the first conductive type doped semiconductor layer 204 for each of LED dies 212A/212B in the structure 100. The top metal contact layer 112 (e.g., n-contact) connected to the first type conductive type doped semiconductor layer 208 as the top electrode. The top metal contact layer 112 may be nickel, silver, or nickel/silver alloys.

Figure 5:
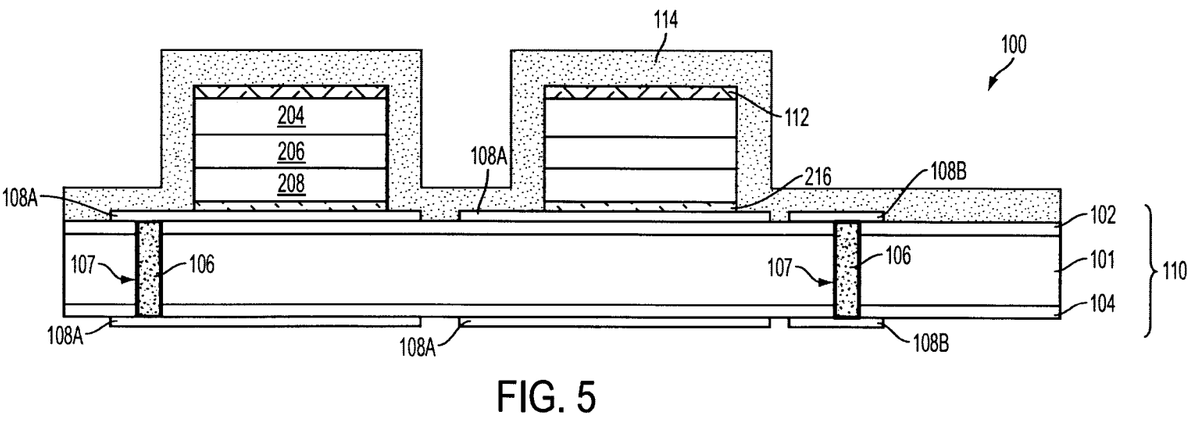
Figure 6:
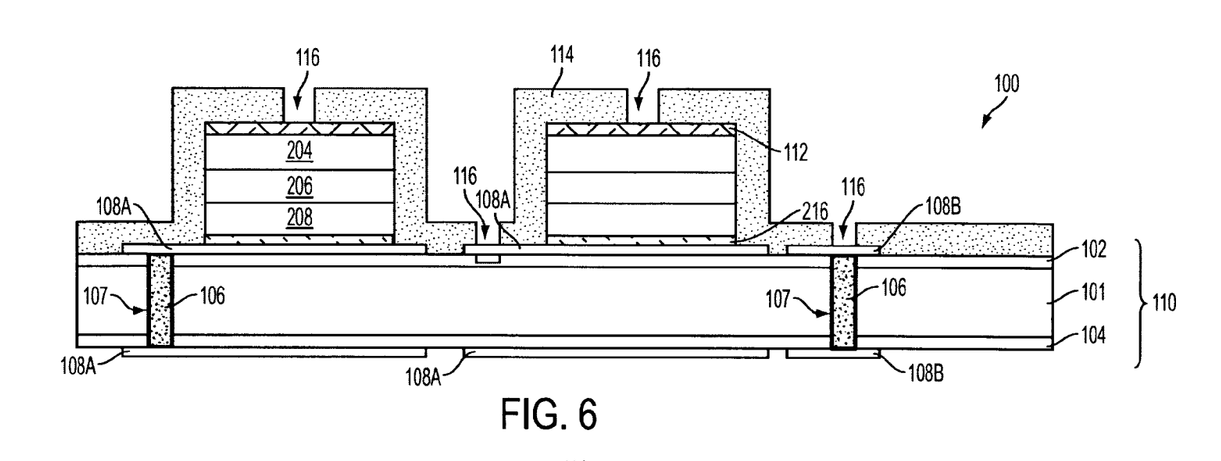

FIG. 5 and FIG. 6 illustrate stages for forming a patterned isolation layer, e.g., in accordance with operation 19b of FIG. 1B. FIG. 5 illustrates a stage in which an isolation layer 114 is deposited over each of LED dies 212A/212B and the carrier substrate 110 of the structure 100. Particularly, the isolation layer 114 covers the top electrode 112 of the LED dies 212A/212B, metal bonding pads 108A and metal contact pads 108B of the carrier substrate 110 for isolation and passivation. In one embodiment, the isolation layer 114 is conformal and has a uniform thickness. In another embodiment, the isolation layer 114 includes silicon oxide, aluminum oxide, or other suitable dielectric material (such as a dielectric material transparent to the light emitted by the LED device 212A/212B). Isolation layer 114 is formed by CVD or other technique.

FIG. 6 illustrates a stage in which the isolation layer 114 is patterned to form various via openings (or openings) 116 that expose portions of each LED die 212A/212B and portions of carrier substrate 110 for electrical routing. Portions of top electrode 112 of each LED die 212A/212B, and portions of the metal bonding pads 108A and the metal contact pads 108B of the carrier substrate 101 are exposed for electrical routing. In one embodiment, the patterning of the isolation layer 114 includes a lithography process and etching. For example, one method includes patterning the surface of the isolation layer 114 with a sequential process including photoresist patterning, etching, and photoresist stripping. The etching process may include dry etching, such as fluorine-containing plasma etching. Alternatively, the etching process includes wet etching, such as a hydrofluoride (HF) solution if the isolation layer 140 is a silicon oxide material.

Figure 7:
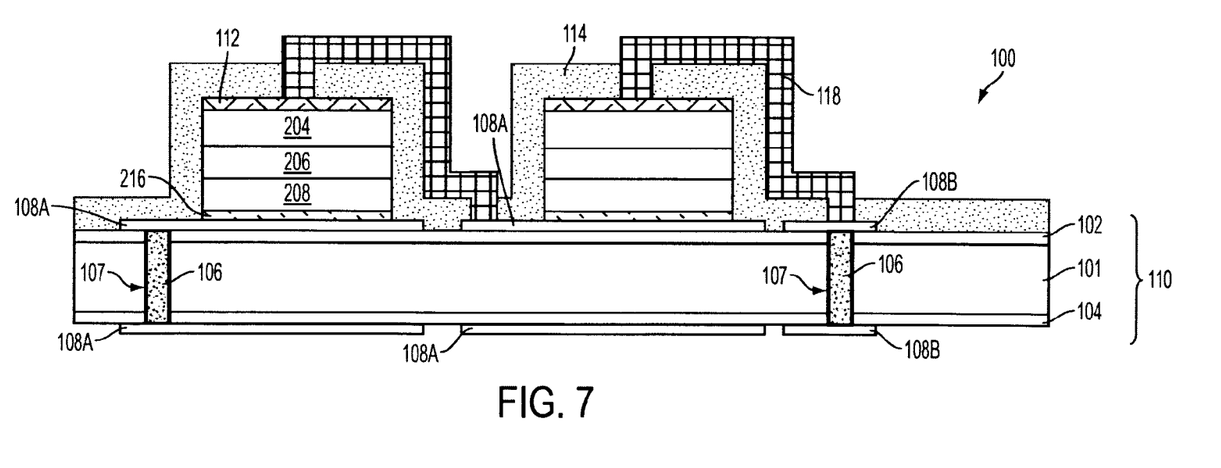

FIG. 7 illustrates a stage in which conductive interconnects 118 are formed on the isolation layer 114 and in the openings 116 to contact the top electrodes 112 of the LED dies 212A/212B, and the metal bonding pads 108A and the metal contact pads 108B of the carrier substrate 110. The conductive interconnects 118 couple the top electrode 112 to the corresponding metal bonding pad 108A and the corresponding metal contact pad 108B. The conductive interconnects 118 provides conductive routing from the electrodes of the LED dies 212A/212B to the metal pads 108A/108B on the carrier substrate 110, therefore also referred to as the re-distribution lines (RDLs) or micro-interconnects. Thus, the various the metal pads 108A/108B serve as electrodes at packaging level. In one embodiment, conductive interconnects 118 electrically connect the top electrode 112 of the LED die 212A/212B to the metal contact pad 108B of on the top surface of the carrier substrate 110. The TSV 106 connects the metal contact pads 108B on the top surface and on the bottom surface of the carrier substrate 110 to establish the electrical path. In another embodiment, conductive interconnects 118 electrically connect the at least two separated LED dies 212A/212B and each of LED dies 212A/212B to the carrier substrate 110. For example, the conductive interconnect 118 electrically connects the top electrode 112 of the LED die 212A to the corresponding metal bonding pad 108A of LED die 212B. The LED die 212A and LED die 212B are electrically coupled together in an array-type LED module. The conductive interconnects 118 may be a metal layer or a transparent conductive layer such as indium tin oxide (ITO) or indium zinc oxide (IZnO). In the process to form the conductive interconnects 118, a barrier layer such as titanium and a seed metal layer such as copper can be deposited on the isolation layer 114. A photoresist layer (not shown) will be laminated on the seed metal layer and patterned in a lithography process followed by etching the seed layer through the patterned photoresist layer and metal plating to define the re-distribution lines for the micro-interconnects. The conductive interconnects 118 may cover the isolation layer to a uniform thickness.

Figure 8:
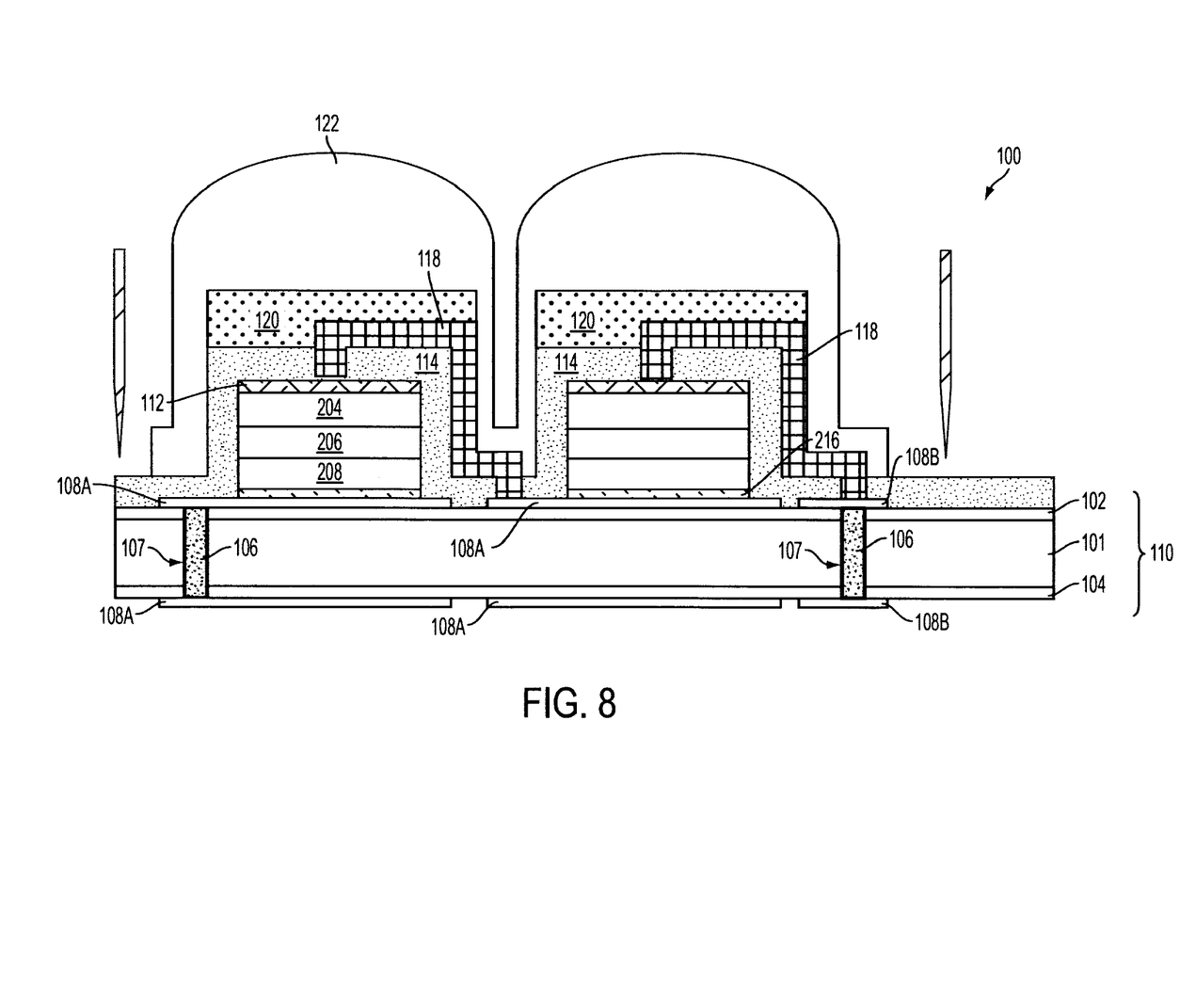

Referring to FIG. 8, a phosphor 120 is distributed around the LED dies 212A/212B to change the wavelength of the emitted light. In one embodiment, the phosphor 120 embedded in a coating material is formed on the conductive interconnect 118 and the isolation layer 114. Phosphor coating may be deposited using a mask or through screen printing to form a surface phosphor layer to only cover the conductive interconnect 118 and the isolation layer 114 on the top surface of the LED dies 212A/212B. Alternatively, phosphor coating may be deposited through a spray process to form a conformal phosphor layer to cover the conductive interconnect 118 and the isolation layer 114 on the top surface and also the side walls of the LED dies 212A/212B to a uniform thickness.

Still referring to FIG. 8, a lens 122 is formed on the phosphor 120 to further shape an emission pattern of the emitted light with enhanced light emission efficiency. In one embodiment, the lens 122 includes epoxy, silicone or other suitable material. In one example, the lens 122 may be formed by placing a lens molding over the LED die 212A/212B, injecting silicone into the lens molding, and curing the injected silicone.

Next, the LED dies 212A/212B along with the patterned isolation layer 114 and the carrier substrate 110 are diced into individual LED packages to complete the wafer level packaging process, e.g., in accordance with operation 23b of FIG. 1B. The separated LED packages include LED dies 212A/212B bonded with the diced carrier substrate 110. In one embodiment, each of the separated LED packages includes only one LED die. In another embodiment, each of the separated LED packages includes two separated LED dies. The two separated LED dies are electrically connected through conductive interconnects 118.

FIGS. 9 to 11 illustrate cross-sectional views of a structure 201, which are incorporated in the semiconductor structure 100, for forming LED arrays 218A/218B at various stages of manufacture in accordance with this disclosure. Referring to FIG. 9, the structure 201 includes a growth substrate 200, and a light-emitting structure 210 grown over the growth substrate 200. In one embodiment, the growth substrate 200 is sapphire. In other embodiments, the growth substrate 200 may be silicon carbide, silicon, gallium nitride, or another suitable material for growing the light-emitting structure 210. An un-doped semiconductor layer 202, acting as a buffer layer and often comprising gallium nitride or aluminum nitride, is grown on the growth substrate 200 in epitaxial growth processes. The buffer layer may be about 500 nm to 5Elm, for example, about 2 Elm. A light-emitting structure 210 is formed over the buffer layer 202. The light-emitting structure 210 is usually a semiconductor diode. In the present embodiment, the light-emitting structure 210 sequentially includes a first conductive type doped layer 204, a multiple quantum well layer (MQW) 206, and a second conductive type doped layer 208. The first conductive type doped layers 204 and the second conductive type doped layer 208 are oppositely doped semiconductor layers. In some embodiments, the first conductive type doped layer 204 includes an n-type gallium nitride material, and the second conductive type doped layer 208 includes a p-type gallium nitride material. In other embodiments, the first conductive type doped layer 204 may include a p-type gallium nitride material, and the second conductive type doped layer 208 may include an n-type gallium nitride material. The MQW layer 206 shown in FIG. 9 includes alternating (or periodic) layers of two different compound semiconductor materials, for example, gallium nitride and indium gallium nitride. For example, in one embodiment, the MQW layer 206 includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency of the light-emitting structure 210 depends on the number of alternating layers and thicknesses of those layers. The thickness of the MQW layer 206 may be about 10-2000 nm, about 100-1000 nm, about 1 Elm, or about 100 nm, for example.

In FIG. 9, the first conductive type doped layer 204, the multiple quantum well layer (MQW) 206, and the second conductive type doped layer 208 are all formed by epitaxial growth processes. The layers 204, 206 and 208 are epitaxially grown on a top surface 203 of the buffer layer 202. The doping may be accomplished by adding impurities into a source gas during the epitaxial growth process or by other doping processes. After the completion of the epitaxial growth process, a p-n junction (or a p-n diode) is essentially formed in the MQW layer 206 between the doped layer 204 and the doped layer 208. When an electrical voltage is applied between the first conductive type doped layer 204 and the second conductive type doped layer 208, electrical current flows through the light-emitting structure 210 and the light-emitting structure 210 emits radiation. The color of the light emitted by the light-emitting structure 210 is determined by the wavelength of the emitted radiation, which may be "tuned" (or selected) by varying the composition and structure of the materials that make up the light-emitting structure 210. For example, a small increase in the concentration of indium in the indium gallium nitride layer in the MQW 206 is associated with a shift of the light's wavelength output toward longer wavelengths.

Referring to FIG. 10, the structure 201 shown in FIG. 9 is patterned to form a plurality of mesa structures (e.g., 212A and 212B) of light-emitting structure 210. The separated mesa structures make up the LED dies. For example, the mesa structure 212A refers to LED die 212A. The mesa structure 212B refers to LED die 212B. The mesa structures are defined by photolithography patterning processes and etching processes. The mesa structures are etched from the top surface of the second conductive type doped layer 208 to expose a portion of the buffer layer 202. The mesa structure 212A of LED die 212A and the mesa structure 212B of LED die 212B are separated by a trench 214. The mesa structure of each LED die is connected to the buffer layer 202 and the growth substrate 200.

Referring to FIG. 11, the bottom metal contact layer 216 (e.g., p-contact) is formed on the top surface of the second conductive type doped layer 208 for each mesa structure 212A/212B. Each LED die (e.g., 212A and 212B) contains the bottom metal contact layer 216 on the doped layer 208 to form an ohmic contact as the bottom electrode. The bottom metal contact layer 216 may be nickel, silver, or nickel/silver alloys.

Next, the structure 201 shown in FIG. 11 is diced through the growth substrate 200 and buffer layer 202 into a plurality of discrete LED arrays 218A/218B. In one embodiment, the dicing is performed by laser sawing. Each LED array 218A/218B includes the growth substrate 200 and at least two separated LED dies 212A/212B grown over the growth substrate 200. Each LED array 218A/218B is incorporated in methods 11 and 12 for fabricating LED packages.

Various embodiments of the present disclosure may be used in place of previous LED package manufacturing processes. Each of discrete LED arrays 218A is bonded to the carrier substrate 110 by simultaneously bonding each of separated LED dies 212A/212B. Bonding several of LED dies 212A/12B at the same time improves the efficiency of the process and reduces the cost compared with bonding each LED die individually. A plurality of LED dies are bonded to the carrier substrate 110 at a wafer level. The operations of forming the isolation layer 114 and conductive interconnects 118 are performed for the plurality of LED dies on the wafer level at the same time. The process time and the cost are further reduced. Conductive interconnects 118 between the LED die and the corresponding carrier substrate provide electrical connections for LEDs with a small form factor and robust electrical and optical characteristics of the packaged LEDs. An array-type LED module including at least two LED dies electrically connected in one LED package with simplified process operations and efficient process time is formed.

Although the embodiments and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. Accordingly, the appended claims are intended to include within their scope such processes, machines, manufacture, compositions of matter, means, methods, or steps.

What is claimed:
1. A package structure, comprising:
  a substrate having a first side and a second side opposite to the first side;
  a plurality of through-silicon-vias (TSVs) extending through the substrate from the first side to the second side;
  a first light-emitting diode (LED) die and a second LED die disposed over the first side of the substrate, wherein the first and second LED dies each include a multiple-quantum-well layer disposed between a p-type semiconductor layer and an n-type semiconductor layer;

a dielectric isolation layer disposed over the first and second LED dies in a conformal manner;

a first conductive interconnect element extending through the dielectric isolation layer and electrically coupling the n-type semiconductor layer of the first LED die through a first conductive pad to the p-type semiconductor layer of the second LED die through a second conductive pad, wherein one of the first and second conductive pads is disposed above a top surface of the multiple-quantum-well layer, and wherein the other one of the first and second conductive pads is disposed below a bottom surface of the multiple-quantum-well layer; and a second conductive interconnect element extending through the dielectric isolation layer and electrically coupling one of the first and second LED dies to at least one of the TSVs.

2. The package structure of claim 1, wherein the first and second LED dies are parts of a discrete LED array, and wherein the package structure comprises a plurality of discrete LED arrays disposed over the substrate.

3. The package structure of claim 1, wherein the substrate comprises one of: a silicon substrate, a ceramic substrate, a directed copper bonded substrate, a composite substrate, and a printed circuit board.

4. The package structure of claim 1, further comprising:
a first dielectric layer disposed over the first side of the substrate; and
a second dielectric layer disposed over the second side of the substrate.

5. The package structure of claim 1, wherein the dielectric isolation layer has a uniform thickness.

6. The package structure of claim 1, wherein the dielectric isolation layer is substantially transparent.

7. The package structure of claim 1, further comprising:
a plurality of first bond pads disposed over the first side of the substrate and electrically coupled to the TSVs from the first side, respectively; and
a plurality of second bond pads disposed over the second side of the substrate and electrically coupled to the TSVs from the second side, respectively.

8. The package structure of claim 1, wherein the first and second conductive interconnect elements contain metal.

9. The package structure of claim 1, wherein the first and second conductive interconnect elements contain one of: indium tin oxide and indium zinc oxide.

10. A light-emitting diode (LED) packaging structure, comprising:
a carrier wafer having a first surface and a second surface opposite to the first surface;
a plurality of through-silicon-vias (TSVs) extending through the wafer from the first surface to the second surface; and
a plurality of LED arrays disposed over the carrier wafer, wherein each LED array includes:
a plurality of LED dies that each include a p-type semiconductor layer, an n-type semiconductor layer, and a multiple-quantum-well layer disposed between the p-type and the n-type semiconductor layers;
a passivation layer conformally coated around each LED die; and
a plurality of interconnect components electrically coupling the LED dies together and electrically coupling the LED dies to at least one of the TSVs, wherein the LED dies are electrically coupled together in a manner such that a top side of the n-type semiconductor layer of each LED die is connected to a bottom side of the p-type semiconductor layer of an adjacent LED die.

11. The LED packaging structure of claim 10, wherein the carrier wafer comprises one of: silicon, ceramic, or a printed circuit board (PCB).

12. The LED packaging structure of claim 10, further comprising: a dielectric material coated on the first and second surfaces of the carrier wafer.

13. The LED packaging structure of claim 10, wherein the passivation layer has a uniform thickness and is substantially transparent.

14. The LED packaging structure of claim 10, further comprising a plurality of metal pads disposed on the first and second surfaces of the carrier wafer and electrically coupled to at least one of the TSVs.

15. The LED packaging structure of claim 10, wherein the plurality of interconnect components contain indium tin oxide or indium zinc oxide.

16. The LED packaging structure of claim 10, wherein the LED array comprises a plurality of lenses that each cover a respective one of the LED dies.

17. A light-emitting diode (LED) packaging structure, comprising:
a substrate;
a first LED die and a second LED die each disposed over the substrate, the first and second LED dies each including an n-doped layer, a p-doped layer, and an active layer disposed between the n-doped layer and the p-doped layer;
an insulating layer disposed over top and side surfaces of the first LED die and the second LED die; and
an interconnect element having:
a first distal portion that is electrically coupled to the n-doped layer of the first LED die from a first side; and
a second distal portion that is electrically coupled to the p-doped layer of the second LED die from a second side, wherein one of the first and second sides is a top side of the first LED die or the second LED die, and the other one of the first and second sides is a bottom side of the first LED die or the second LED die.

18. The LED packaging structure of claim 17, further comprising a through-silicon-via (TSV) that extends through the substrate, the TSV being electrically coupled to the first and second LED dies.

19. The LED packaging structure of claim 17, wherein:
the first distal portion is electrically coupled to the n-doped layer through a first conductive pad disposed on the first side of the n-doped layer; and
the second distal portion is electrically coupled to the p-doped layer through a second conductive pad disposed on the second side of the p-doped layer.

20. The LED packaging structure of claim 17, wherein the first distal portion is located in a higher position than the second distal portion.

* * * * *